(12) United States Patent
Cimaz et al.

(10) Patent No.: US 12,160,117 B2
(45) Date of Patent: Dec. 3, 2024

(54) QUALITY FACTOR ESTIMATION OF AN INDUCTIVE ELEMENT

(71) Applicants: STMicroelectronics S.r.l., Agrate Brianza (IT); STMicroelectronics (Grand Ouest) SAS, Le Mans (FR)

(72) Inventors: Lionel Cimaz, Pleumeleuc (FR); Antonio Borrello, Cornaredo (IT); Simone Ludwig Dalla Stella, Milan (IT)

(73) Assignees: STMicroelectronics (Grand Ouest) SAS, Le Mans (FR); STMicroelectronics S.r.l., Agrat Brianza (IT)

( * ) Notice: Subject to any disclaimer, the term of this patent is extended or adjusted under 35 U.S.C. 154(b) by 0 days.

(21) Appl. No.: 18/154,394

(22) Filed: Jan. 13, 2023

(65) Prior Publication Data

US 2023/0170742 A1     Jun. 1, 2023

Related U.S. Application Data

(62) Division of application No. 17/461,305, filed on Aug. 30, 2021, now Pat. No. 11,588,353.

(30) Foreign Application Priority Data

Aug. 31, 2020    (EP) ..................................... 20305965

(51) Int. Cl.
*H02J 50/12*    (2016.01)
*H04B 5/24*    (2024.01)
*H04B 5/79*    (2024.01)

(52) U.S. Cl.
CPC ................ *H02J 50/12* (2016.02); *H04B 5/24* (2024.01); *H04B 5/79* (2024.01)

(58) Field of Classification Search
None
See application file for complete search history.

(56) References Cited

U.S. PATENT DOCUMENTS

| | | |
|---|---|---|
| 9,490,745 B1 | 11/2016 | Toso et al. |
| 2011/0285210 A1 | 11/2011 | Lemmens et al. |
| 2012/0126765 A1* | 5/2012 | Stone .................. H02M 3/1588 323/283 |
| 2013/0300209 A1 | 11/2013 | Long et al. |
| 2017/0085131 A1 | 3/2017 | Liu et al. |
| 2019/0140489 A1 | 5/2019 | Liu et al. |
| 2020/0323044 A1 | 10/2020 | Kang et al. |
| 2021/0091600 A1 | 3/2021 | Chen et al. |

* cited by examiner

*Primary Examiner* — Adi Amrany
(74) *Attorney, Agent, or Firm* — Slater Matsil, LLP

(57) ABSTRACT

The present disclosure relates to a device comprising an inductive element and a first capacitive element series connected between a first node and a second node, a first MOS transistor connected between the first node and a third node configured to receive a reference potential, the second node being coupled directly or via a second MOS transistor to the third node, a second capacitive element connected between a fourth node and an interconnection node between the first capacitive element and the inductive element, a current generator configured to provide an AC current to the fourth node, and a switch connected between the fourth node and the third node.

20 Claims, 2 Drawing Sheets

QUALITY FACTOR ESTIMATION OF AN INDUCTIVE ELEMENT

CROSS-REFERENCE TO RELATED APPLICATIONS

This application is a divisional of U.S. patent application Ser. No. 17/461,305, filed Aug. 30, 2021, entitled "Quality Factor Estimation of an Inductive Element," which application claims the benefit of European Patent Application No. 20305965.4, filed on Aug. 31, 2020, which applications are hereby incorporated by reference herein in their entirety.

TECHNICAL FIELD

The present disclosure relates generally to electronic devices and methods, and more particularly to electronic devices and methods for supplying power to other devices by using a wireless link, i.e., devices and methods for providing a wireless power supply to another device.

BACKGROUND

Electronic devices adapted to provide a wireless power supply to another device are known. In such devices, an alternating signal is provided to an antenna of the devices, which then emit a magnetic field. The magnetic field is received by a device to be wirelessly power supplied, which use the power carried by the magnetic field to be power supplied.

SUMMARY

There is a need to overcome at least some of the drawbacks of known devices configured to provide a wireless power supply.

For example, there is a need for an electronic device in which a quality factor of an inductive element of an antenna of the device may be estimated, which addresses at least some of the drawbacks of known devices adapted to provide a wireless power supply.

For example, there is a need to overcome at least some of the drawbacks of known methods for estimating a quality factor of an inductive element of an antenna, particularly when such methods are implemented by the device comprising the antenna.

One embodiment addresses all or some of the drawbacks of known known devices configured to provide a wireless supply power.

One embodiment provides a device comprising an inductive element and a first capacitive element (C) series connected between a first node and a second node, a first metal-oxide-semiconductor (MOS) transistor connected between the first node and a third node configured to receive a reference potential, the second node being coupled directly or via a second MOS transistor to the third node, a second capacitive element connected between a fourth node and an interconnection node between the first capacitive element and the inductive element, a current generator configured to provide an alternating current (AC) current to the fourth node, and a switch connected between the fourth node and the third node.

According to an embodiment, a value of the first capacitive element is at least 100 times higher than a value of the second capacitive element.

According to an embodiment, the current generator is connected between the fourth node and a fifth node configured to receive a supply voltage.

According to an embodiment, the first transistor is part of a half bridge connected between the third node and a sixth node configured to receive a supply voltage.

According to an embodiment, the second transistor is part of another half bridge connected the third and sixth nodes.

According to an embodiment, a frequency of the generator is controllable.

According to an embodiment, the device comprises a circuit configured to control the frequency of the generator so that the frequency of the generator is equal to a frequency of a voltage of the interconnection node.

According to an embodiment, the circuit comprises a detector configured to provide a binary signal and to switch the binary signal each time the voltage of the interconnection node crosses the reference potential, and wherein the generator is configured to switch the AC current between a high level and a low level at each switching of the binary signal.

According to an embodiment, the device comprises a circuit configured to measure the frequency of the voltage of the interconnection node.

According to an embodiment, the circuit configured to measure the frequency of the voltage of the interconnection node comprises a circuit, for example a counter, configured to measure a frequency of the binary signal.

According to an embodiment, the device comprises a circuit configured to measure a voltage of the interconnection node.

According to an embodiment, the device comprises a control circuit configured to couple the first and second nodes to the third node and to open the switch during a phase of estimation of a quality factor of the inductive element, and to close the switch otherwise.

One embodiment provides a wireless charger comprising the disclosed device, wherein the inductive element and the first capacitive element form an antenna of the wireless charger.

One embodiment discloses a method implemented with the device or with the wireless charger, comprising coupling the first and second nodes to the third node and opening the switch at the beginning of a phase of estimation of a quality factor of the inductive element, measuring, during the implementation of the phase, a voltage of the interconnection node when the AC current has a frequency equal to a resonance frequency of the series association of the inductive element and the first capacitive element, measuring the resonance frequency; and closing the switch at the end of the phase.

According to an embodiment, the method further comprises an estimation of a quality factor of the inductive element based on the measured voltage, a capacitance value of the first capacitive element, a value of the AC current and the measured resonance frequency.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Furthermore, a component such as a transistor, a switch, an inductive element or a capacitive element is said to be connected between two nodes when a first conduction terminal of the component is coupled, preferably connected, to a first of these two nodes, and a second conduction terminal of the component is coupled, preferably connected, to a second of these two nodes.

In the following disclosure, unless indicated otherwise, an inductive element, respectively capacitive element, and an inductance value, respectively a capacitance value, of this element will be designated by the same reference.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially," and "in the order of" signify within 10%, and preferably within 5%.

Figure 1:
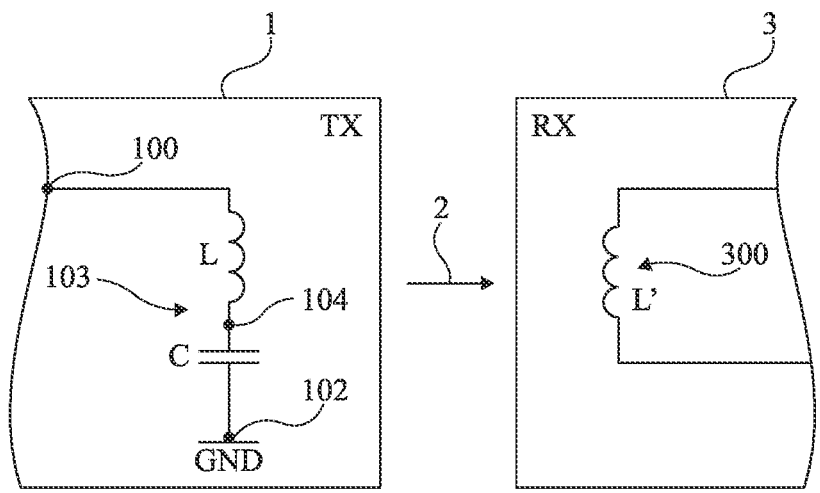
FIG. 1 illustrates, in a schematic manner, a device providing a wireless power supply to another device.

FIG. 1 illustrates, in a schematic manner, a device 1 providing a wireless power supply 2 to another device 3, the wireless power supply being represented by an arrow 2 on FIG. 1.

The device 1 (bloc TX) is adapted to provide the wireless power supply 2. The device 1 is, for example, a wireless charger.

The device 1 comprises an inductive element L, typically an inductor such as a coil or a winding, and a capacitive element C, typically a capacitor, which are series connected between two nodes 100 and 102. The node 100 is configured to receive an alternating current (AC) signal, typically an AC voltage. The node 102 is configured to receive a reference potential, typically ground (GND), the AC voltage received by node 100 being for example referenced to the reference potential GND. The elements C and L form an antenna 103 of the device 1.

The device 3 comprises an antenna 300, which comprises an inductive element L', typically an inductor such as a coil or a winding.

When the AC signal is provided to node 100, at a frequency equal to, or in the order of, a resonance frequency of the antenna 103, a wireless power supply 2 is emitted by the antenna 103, under the form of a magnetic field. When the devices 1 and 3 are close enough to each other, the inductive element L' receives the magnetic field 2, or, said in other words, the inductive elements L and L' are coupled together and form a low coupled transformer. As a result, a current is flowing through the inductive element L' and a voltage is present across the inductive element L', which allows to power supply the device 3.

When the device 1 is emitting wireless power supply 2, any foreign conductive object, i.e., any conductive object which are not a device 3 configured to be wirelessly supplied by the wireless power supply 2, which is disposed in the magnetic field emitted by the device 1 is going to heat because the emitted magnetic field induces Foucault currents inside the conductive object. A temperature of the conductive object may then be higher than 80° C., for example higher than 100° C. For such temperatures, the conductive object may injure a user of the device 1, or may deteriorate the device 1. For example, when the device 1 comprises a plastic housing, the plastic may melt because of the high temperature of the conductive object, in particular if the conductive object is resting on the housing of the device 1. As an example, the conductive object may be a metallic coin or a metallic key.

To avoid the issue described in the previous paragraph, the device 1 may be configured to detect, before providing the wireless power supply 2, if an object disposed in its emitted magnetic field is a device to be wirelessly power supplied or a foreign conductive object. If the device 1 detects that the object in its magnetic field is a foreign conductive object, the device 1 then does not provides the wireless power supply 2.

One way the device 1 may detect that a foreign conductive object is in its emitted magnetic field is by determining or evaluating the quality factor QfL of the inductive element L. Indeed, the quality factor QfL is representative of the ability of the inductive element L to preserve the energy inside the inductive element L. When a foreign conductive element is heating because of the magnetic field emitted by the device 1, energy is extracted from the inductive element L by the foreign conductive object, which results in a decrease of the quality factor QfL.

As an example, such a way to detect the presence of a foreign conductive object in the magnetic field 2 is required by the Qi specification, which was developed by the Wireless Power Consortium (WPC).

The elements L and C form a resonating LC filter. The quality factor QfLC of the LC filter is then equal to the ratio between the magnitude of the oscillations of a voltage of the interconnection node 104 between the components L and C, and the magnitude of an excitation voltage applied on a terminal of the inductance opposite to the interconnection node 104, i.e. the node 100 in FIG. 1, when this excitation voltage is at the resonance frequency f0 of the LC filter.

The quality factor QfL(f0) of the inductive element L of the LC filter at the resonance frequency f0 is, in practice, equal to the quality factor QfLC of the LC filter.

However, it could be desirable to determinate the quality factor QfL(f) of the inductive element L at a given frequency f, which may be different from the resonance frequency f0 of the LC filter. For example, the Qi specification requires that the quality factor QfL(f) of the inductive element L is determined at a frequency f equal to 100 KHz.

Further, when evaluating the quality factor QfL(f) of the inductive element L, the magnitude of the voltage on the interconnection node 104 may be high enough to wake up or activate the device 3. Such wake up of the device 3 when evaluating the quality factor QfL(f) should be avoided. Indeed, as soon as the device 3 is activated, it will draw energy from the inductive element L to be wirelessly power supplied, which results on a decrease of the quality factor QfL(f). The device 1 detecting this decrease will consider that a foreign conductive object is in its emitted magnetic field, and will then not providing the wireless power supply 2 to the device 3. As a result, the device 3 will not be wirelessly power supplied.

As an example, in the Qi specification, the peak to peak magnitude of the voltage on node 104 should not exceed 1V to not wake up a device to be wirelessly power supplied.

Although this is not shown in FIG. 1, the device 1 comprises a circuit for providing the AC voltage to node 100 when device 1 is wirelessly power supplying the device 3, this circuit being, for example, a half bridge comprising two metal-oxide-semiconductor (MOS) transistors series connected between node 102 and a node configured to receive a supply voltage. However, during a phase of evaluation of the quality factor QfL(f), it is desirable to reduce or suppress the influence of this circuit on the estimation of the quality factor QfL(f).

Further, it is desirable that a duration of a phase of estimating the quality factor QfL(f) is as short as possible, to shorten a duration between the instant where a device 3 enters in the magnetic field emitted by the device 1 and the instant where a wireless power supply is effectively provided to device 3 by the device 1. For example, the Qi specification requires that this last duration does not exceed 3 seconds, which requires that the estimation of the quality factor QfL(f) of the element L is done in less than 3 seconds, for example in less than 1 second. Such duration is for example not compatible with a method in which the evaluation of the quality factor QfL(f) would be done by swapping the frequency of an AC voltage applied on node 100 and measuring the corresponding voltage on node 104 until the measured voltage is maximum, so that the frequency of the applied voltage is the resonance frequency of the antenna 103.

Figure 2:
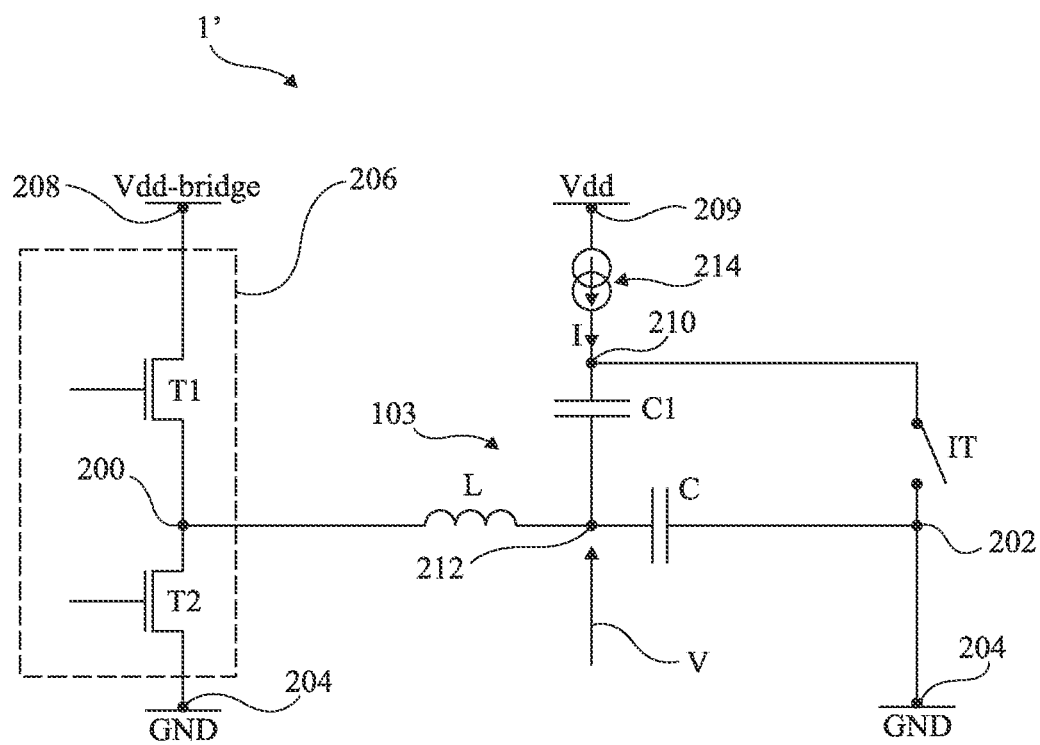
FIG. 2 illustrates an embodiment of a device adapted to provide a wireless power supply to another device.

FIG. 2 illustrates an embodiment of a device 1' adapted to provide a wireless power supply to another device, for example to provide the wireless power supply 2 to the device 3 of FIG. 1.

The device 1' comprises, as the device 1 of FIG. 1, the inductive element L and the capacitive element C forming the antenna 103 of the device 1'. The elements L and C are series connected between a node 200 and a node 202.

A MOS transistor T2 is connected between the node 200 and a node 204 configured to receive a reference potential, for example the ground GND.

Preferably, the transistor T2 is part of a half bridge 206. The half bridge 206 is configured to provide an AC signal to node 200 when the device 1' is providing wireless power supply to another device. The half bridge 206 is connected between the node 204 and a node 208 configured to receive a supply voltage Vdd_bridge, the supply voltage Vdd_bridge being for example a positive DC voltage referenced relative the potential GND. As an example, the supply voltage Vdd_bridge is in the range from 1 V to 24 V or higher. In the example of FIG. 2, the half bridge comprises the transistor T2 and a MOS transistor T1 series connected between the nodes 204 and 208, the transistor T1 being connected between nodes 200 and 208.

In the embodiment of FIG. 2, the node 202 is directly coupled, i.e. connected, to the node 204.

A capacitive element C1, for example a capacitor, is connected between a node 210 and an interconnection node 212 between the elements L and C.

A current generator 214 is connected to node 210. More particularly, the generator 214 is connected between the node 210 and a node 209 configured to receive a supply voltage Vdd, the supply voltage Vdd being for example a positive DC voltage referenced relative the potential GND. As an example, the supply voltage Vdd is in the range from 1.8 V to 5 V. The generator 214 is configured to provide an AC current I to the node 210. The frequency of the AC current I is controllable, i.e., the frequency of the generator 214 is controllable.

A switch IT is connected between the nodes 210 and 204.

A phase of estimating the quality factor QfL(f), implemented by the device 1', will now be described.

At the beginning of this phase, the device 1' is configured to open the switch IT. The switch IT is maintained open during all the phase of estimating the quality factor QfL(f). The device 1' comprises, for example, a control circuit such as a microcontroller configured to control the switch IT.

Further, at the beginning of the phase of estimating the quality factor QfL(f), the device 1' is configured to control the transistor T2 so that the transistor T2 is switched to its on-state. When the transistor T2 is on, the transistor T1 is controlled to be off. Thus, the reference potential GND is applied on node 200. The device 1', for example, comprises a control circuit configured to control the transistor T1 and T2, for example the same control circuit that the one controlling the switch IT.

As the same reference potential GND is applied to both nodes 200 and 202, the resonance gain of the LC filter formed by the element L and C will be maximum.

Then, the generator 214 provides the current I to the node 212. When the generator 214 provides the AC current I to node 210, the node 210, and thus the capacitive element C1, is charged and discharged based on the polarity of the current I. As a result, the voltage V of the node 212 oscillates. The charging and discharging of the capacitive element C1 have no influence on the quality factor QfL(f).

The capacitive element C1 allow that the generator 214 is supplied by the positive voltage Vdd, while a voltage V on the node 212 oscillates around the reference potential GND. Said in other words, the capacitive element C1 is a DC blocking capacitive element.

As an example, when voltage V oscillates between +0.5 V and −0.5 V and a voltage on the node 210, referenced relative to the potential GND, oscillates between 2.2 V and 0.8 V, a value of the voltage Vdd equal to 3 V is sufficient to power supply the generator 214.

$$|Z_{f0}| = \sqrt{\frac{L}{C} + \frac{1}{R} \cdot \frac{1}{C}}$$

The generator 214 is controlled by a control circuit of the device 1', so that the frequency of the voltage V is equal to the resonance frequency f0 of the LC filter formed by the elements L and C. Thus, at the frequency f0, the impedance module of the impedance viewed by the node 212 is given by the following relation:

$$|Z_{f0}| = \sqrt{\frac{L}{C} + \frac{1}{R} \cdot \frac{1}{C}} \qquad \text{[Math. 1]}$$

$$|Z_{f0}| = \sqrt{\frac{L}{C}} + \frac{1}{R} \cdot \frac{1}{C}$$

in which $Z_{f0}$ is the complex impedance of node 212 at the resonance frequency f0 and R is the equivalent series resistor of the LC filter, the intrinsic resistance RL of the element L being included inside the equivalent resistor R.

$$QfL(f) = \frac{w.L}{R}$$

further, the quality factor QfL(f) of the element L at a given frequency f can be expressed by the following relation:
[Math. 2]

$$QfL(f) = \frac{w.L}{R}$$

in which w is the pulsation corresponding to this given frequency f, the pulsation w being equal to $2 \cdot \Pi \cdot f$.

$$QfL(f0) = \frac{v}{i.L.w0} - 1$$

Thus, based on the relations Math. 1 and Math. 2, the quality factor QfL(f0) at the resonance frequency f0 can be expressed by the following relation:

$$QfL(f0) = \frac{v}{i.L.w0} - 1 \quad \text{[Math. 3]}$$

$$QfL(f0) = \frac{v}{i.L.w0} - 1$$

in which i is the magnitude of the current I, v is the magnitude of the voltage V and w0 is the pulsation at the resonance frequency f0.

$$w0 = \frac{1}{\sqrt{L.C}}$$

As the pulsation w0 at the resonance frequency f0 of the LC filter can be expressed by the following relation:

$$w0 = \frac{1}{\sqrt{L.C}} \quad \text{[Math. 4]}$$

$$w0 = \frac{1}{\sqrt{L.C}}$$

the quality factor QfL(f0) at the resonance frequency f0 can be expressed by the following relation:

[Math.]

$$QfL(f0) = \frac{v.C.w0}{i} - 1 \quad 5]$$

The device 1' comprises a circuit (not shown on FIG. 2) configured to measure the voltage V, and, more particularly, the magnitude v of the voltage V.

The device 1' further comprises a circuit (not shown on FIG. 2) configured to measure the pulsation w of the voltage V on the node 212, which allows the device 1' to know the value of the pulsation w0.

The device 1' is thus able to determine the values w0 and v at the resonance frequency f0. Further, the value of the element C and the value i are constant and known by the device 1'. As a result, the device 1' is able to determine the value of the quality factor QfL(f0) of the inductive element L at the resonance frequency with the above relation Math. 5.

$$QfL(f) = \frac{w}{w0} \cdot QfL(f0).$$

According to an embodiment, the device 1' is further configured to determinate the quality factor QfL(f) for a given frequency f by using the following relation:

$$QfL(f) = \frac{w}{w0} \cdot QfL(f0). \quad \text{[Math. 6]}$$

$$QfL(f) = \frac{w}{w0} \cdot QfL(f0).$$

Said in other words, the device 1' is configured to determinate the value of the quality factor QfL(f) of the inductive element L at any frequency f, based on the measured voltage V at the resonance frequency f0 of the LC filter, the measured frequency f0, the known value of the current I and the known value of the element C.

As an example, the device 1' comprises a processing unit (not shown on FIG. 2) such as a microcontroller configured to determinate, with the above relations Math. 5 and Math. 6, the value of the quality factor QfL(f) based on the measured voltage V at the resonance frequency f0 of the LC filter, the measured frequency f0, the known value of the current I and the known value of the element C.

The operation of the device 1' during a phase of evaluation of the quality factor QfL(f) of the inductive element L has been described. The normal operation of the device 1', i.e., when no phase of evaluation of the quality factor QfL(f) is implemented, for example when the device 1' is providing wireless power supply, will now be described.

During normal operation, the device 1' is configured to close the switch IT, and to maintain the switch IT closed. Thus, even if the magnitude v of the voltage V is high relatively to the maximum voltage the generator 214 can support, this will not affect the generator 214 as the node 210 is at the reference potential GND. Said in other words, the closed switch IT protects the generator 214 against the high voltage V when the device 1' is wirelessly power supplying another device.

It can be noticed that, when the switch IT is closed, the capacitive elements C and C1 are connected in parallel between the nodes 212 and 204.

According to one embodiment, the value of the capacitive element C1 is at least 100 times lower than the value of the capacitive element C, so that, in normal operation, the contribution of the element C1 in the equivalent capacitor formed by the connection of the elements C1 and C in parallel between nodes 212 and 204 is negligible.

According to an alternative embodiment, the value of the element C1 is chosen so that the equivalent capacitor formed by the connection of the elements C1 and C in parallel between nodes 212 and 204 has a target value, for example a target value determined by the frequency of the AC voltage applied on the node 200 during normal operation.

In the device 1', the generator 214 preferably provides the current I with a sine waveform shape. However, the generator may also provide the current I with a square shape waveform. In this last case, the harmonics of the current I are filtered by the LC filter formed by the elements L and C.

In the device 1', according to one embodiment, to ensure that the current I is at the resonance frequency f0 of the LC filter when evaluating the quality factor QfL(f0) of the inductive element L, the device 1' is configured to swap the frequency of the generator 214 until the magnitude of the voltage V on node 212 is maximum, which indicates that the voltage V, thus the current I, have a frequency equal to the resonance frequency f0 of the LC filter.

vmax=i·L·w0·(1+Qfmax) According to one embodiment, the maximal value Qfmax that can be taken by the quality factor QfLC of the LC filter at its resonance frequency is known, this value Qfmax being for example determined by means of simulation or calculation tools. Thus, during a phase of estimation of the quality factor QfL(f), the maximum magnitude vmax that can be taken by the voltage V at the resonance frequency f0 can be expressed by the following relation:

$$v\max = i \cdot L \cdot w0 \cdot (1 + Qf\max)$$

$$v\max = i \cdot L \cdot w0 \cdot (1 + Qf\max) \quad [\text{Math. 7}]$$

imax<vtarget/(L·w0·(1+Qfmax) Thus, to ensure that the value vmax does not exceed a target value vtarget, for example equal to 1 V peak to peak in the Qi specification, the peak to peak magnitude i of the current I should be below a value imax, which can be expressed by the following relation:

$$i\max < v\text{target}/(L \cdot w0 \cdot (1 + Qf\max)$$

$$i\max < v\text{target}/(L \cdot w0 \cdot (1 + Qf\max) \quad [\text{Math. 8}]$$

For example, the value imax is in the order of 1.6 mA when the component L has an inductance value of 10 µH, the frequency f0 is in the order of 100 KHz, the target value vtarget is equal to 1V peak to peak and the maximal quality factor Qfmax is equal to 100.

Thus, the magnitude of the current I of the device 1' is preferably selected so that the magnitude of the voltage V does not exceed the target value vtarget, the value vtarget being lower enough to not wake up a device to be wirelessly power supplied, which is disposed in the magnetic field emitted by the device 1'.

In the above description, the estimation of the quality factor QfL(f) implemented by the device 1' was done considering the equivalent series resistance R, which, in practice, is equal to the on-state resistance RT2 of the transistor T2 plus the intrinsic resistance RL of element L.

$$QfLc(f) = \frac{QfL(f)}{1 - RT2 \cdot w0 \cdot C \cdot QfL(f)}$$

According to one embodiment, the device 1', for example its processing unit configured to determine the quality factor QfL(f) at a given frequency f, is further configured to provide a corrected value QfLc(f) of the quality factor QfL(f), which takes into account the on-state resistance RT2. The corrected value QfLc(f) can be determined by the following relation:

$$QfLc(f) = \frac{QfL(f)}{1 - RT2 \cdot w0 \cdot C \cdot QfL(f)} \quad [\text{Math. 9}]$$

$$QfLc(f) = \frac{QfL(f)}{1 - RT2 \cdot w0 \cdot C \cdot QfL(f)}$$

According to another embodiment, as the resistance RT2 is, in practice, at least 5 times or even at least 10 times lower than the resistance RL, the influence of the on-state resistance RT2 in the determination of the quality factor QfL(f) is considered to be negligible.

Figure 3:
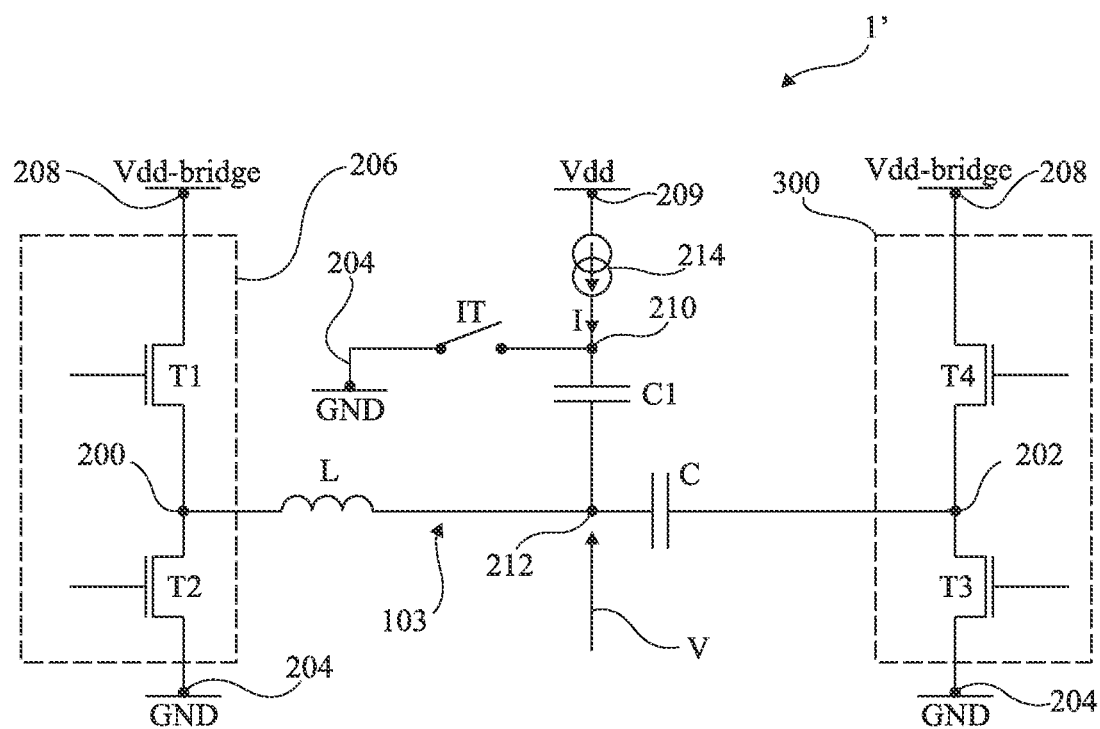
FIG. 3 illustrates an alternative embodiment of the device of FIG. 2.

FIG. 3 illustrates an alternative embodiment of the device 1' of FIG. 2.

The device 1' of FIG. 3 differs from the device 1' of FIG. 2 only by the fact that node 202 is not directly coupled to node 204, but is coupled to the node 204 via a MOS transistor T3. Said in other words, the transistor T3 is connected between nodes 202 and 204.

Preferably, the transistor T3 is part of a half bridge 300. The half bridge 300 is configured, together with the half bridge 206, to provide an AC signal the antenna 103 when device 1' is providing wireless power supply to another device. The half bridge 300 is connected between the nodes 204 and 208. In the example of FIG. 3, the half bridge 300 comprises the transistor T3 and a MOS transistor T4 series connected between the nodes 204 and 208, the transistor T4 being connected between nodes 202 and 208.

The operation of the device 1' of FIG. 3 during a phase of estimation of the quality factor QfL(f) is identic to that of the device 1' of FIG. 2 except that the device 1' of FIG. 3 is further configured to switch the transistor T3 to the on state at the beginning of the estimation phase of the quality factor QfL(f), and to maintain the transistor T3 in the on state during all the duration of this phase. Thus, during an estimation phase of the quality factor QfL(f), the reference potential GND is applied to both nodes 200 and 202.

Those skilled in the art will be capable of adapting other aspects of the description of the device 1' made in relation with FIG. 2 to the device 1' of FIG. 3. For example, those skilled in the art will be capable of adapting the relation Math. 9 to consider the on-state resistance RT3 of the transistor T3 when computing the corrected value QfLc(f).

Figure 4:
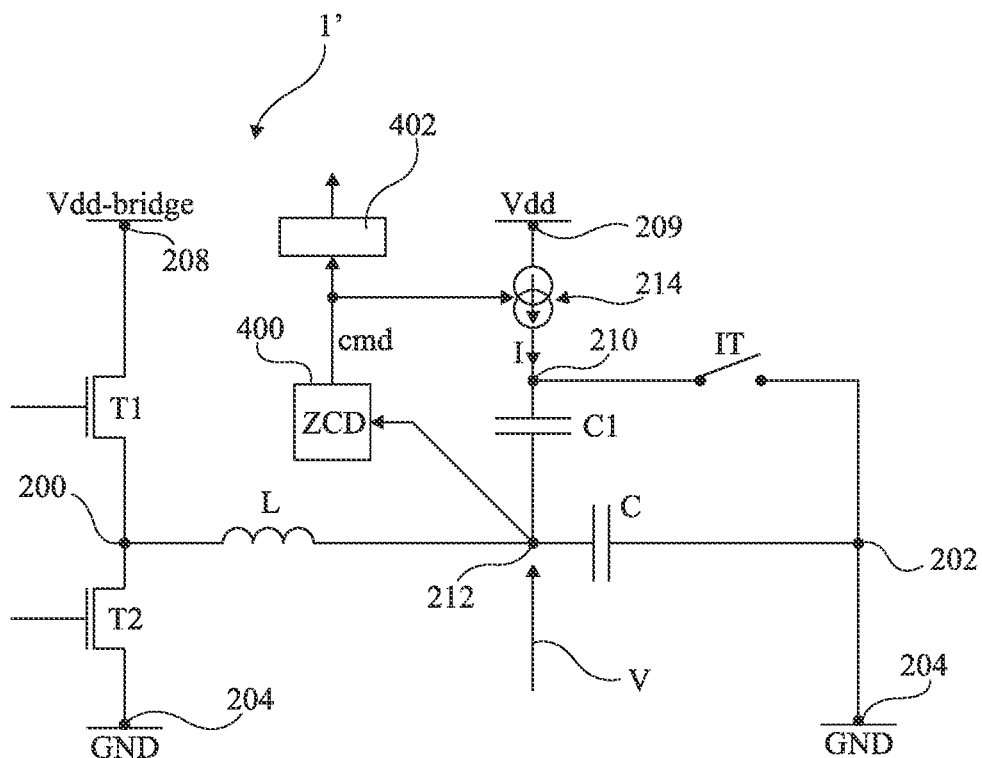
FIG. 4 illustrates, in more detail, an example embodiment of the device of FIG. 2.

FIG. 4 illustrates, in more details, an example embodiment of the device 1' of FIG. 2.

In this embodiment, the device 1' comprises a circuit or detector 400 (block ZCD), which is connected to the node 212. The circuit 400 is configured to provide a binary signal cmd, i.e., a signal cmd which switches between two values or level, to known a high level and a low level. The circuit 400 is further configured to switch the signal cmd each time the voltage V crosses the potential GND. Said in other words, the circuit 400 is configured to commute the binary signal cmd between its low and high levels each time the voltage V crosses the null value. Said in yet other words, the circuit 400 is a zero-cross detector. As an example, the circuit 400 is implemented by a comparator having an input receiving the voltage V, another input receiving the potential GND, i.e. a null voltage, and an output providing the signal cmd.

The signal cmd is used as a control signal of the generator 214, and, more particularly, as a control signal of the frequency of the generator 214. Said in other words, in this embodiment, the circuit 400 is the control circuit of the generator 214, and, more precisely, of the frequency of the generator 214.

In this embodiment, the generator 214 is configured to provide a square shaped current I. In other words, the current I can take a high level or value, and a low level or value, the current I being switched between its low and high levels. For example, the high and low values of the current I are equal in absolute values, but have opposite polarities.

In this embodiment, the generator 214 is further configured to switch the current I between its low and high values at each switching of the signal cmd.

As a result, during a phase of estimating the quality factor QfL(f), in steady state, the frequency of the current I is equal to the resonance frequency f0 of the LC filter.

Preferably, after each beginning of a phase of estimation of the quality factor QfL(f), the circuit 400 is configured to implement a start-up function to ensure that the voltage V begins to oscillate.

As an example, to implement this start-up function, the circuit 400 is configured to switch the state of the signal cmd at the end of a temporisation duration, which begins at each beginning of a phase of estimation of the quality factor QfL(f), even if the voltage V does not cross the reference potential GND.

As one other example, to implement this start-up function, the circuit 400 is configured to inject a current noise on the node 212 at the end of a temporisation duration, which begins at each beginning of a phase of estimation of the quality factor QfL(f), even if the voltage V does not cross the reference potential GND.

In this embodiment, to ensure that the frequency of the current I is equal to resonance frequency f0 of the LC filter, rather than swapping the frequency of the generator 214 until the measured voltage V is maximum, the generator 214 is controlled based on a detection that the voltage V is null. As a result, in a steady state, the frequency of the voltage V is equal to the resonance frequency f0, which allows the duration of the estimation phase of the quality factor QfL(f) to be shorter in the device 1' of FIG. 4 than in a device 1' in which the frequency of the generator 214 is swapped until the measured voltage V is maximum.

An advantage of the device 1' of FIG. 4 is that, in a steady state of a phase of estimation of the quality factor QfL(f), the frequency of the signal cmd is equal to the resonance frequency f0 of the LC filter.

According to an embodiment, the device 1' comprises a circuit 402 configured to measure the frequency of the signal cmd. As the signal cmd is a binary signal, the circuit 402 is, for example, a counter or a chronometer configured to measure the duration of each low level of signal cmd, the duration of each high level of the signal cmd, the duration between to rising edges of the signal cmd or the duration between two falling edges of the signal, the frequency f0 being then determined based on the measured duration.

Various embodiments and variants have been described. Those skilled in the art will understand that certain features of these embodiments can be combined and other variants will readily occur to those skilled in the art. In particular, those skilled in the art will be capable of adapting the example embodiment of FIG. 4 to the device 1' of FIG. 3. Further, although the supply voltage Vdd_bridge of the node 209 has been described different from the voltage Vdd of node 208, these two voltages may be equal.

Finally, the practical implementation of the embodiments and variants described herein is within the capabilities of those skilled in the art based on the functional description provided hereinabove.

What is claimed is:

1. A method for operating an electronic device, the electronic device comprising an inductive element and a first capacitive element that is series-connected between a first node and a second node, a first metal-oxide-semiconductor (MOS) transistor connected between the first node and a third node coupled to a reference potential, the second node being coupled directly or via a second MOS transistor to the third node, a second capacitive element connected between a fourth node and an interconnection node between the first capacitive element and the inductive element, and a switch connected between the fourth node and the third node, the method comprising:
providing, by a current generator, an alternating current (AC) current to the fourth node;
coupling the first and second nodes to the third node and opening the switch at a beginning of an estimation phase of a quality factor of the inductive element;
measuring a resonance frequency of the inductive element and the first capacitive element;
measuring, during the estimation phase, a voltage of the interconnection node in response to the AC current having a frequency equal to the measured resonance frequency; and
closing the switch at an end of the estimation phase.

2. The method of claim 1, further comprising estimating the quality factor of the inductive element based on the measured voltage, a capacitance value of the first capacitive element, a value of the AC current, and the measured resonance frequency.

3. The method of claim 1, wherein a first capacitance of the first capacitive element is at least 100 times higher than a second capacitance of the second capacitive element.

4. The method of claim 1, further comprising controlling, by a circuit, a frequency of the current generator so that the frequency of the current generator is equal to a frequency of the voltage of the interconnection node.

5. The method of claim 1, further comprising:
controlling, by a first circuit, a frequency of the current generator; and
measuring, by a second circuit, the frequency of the voltage of the interconnection node.

6. The method of claim 1, further comprising:
controlling, by a first circuit, a frequency of the current generator;
providing, by a detector of the first circuit, a binary signal;
switching, by the detector, the binary signal each time the voltage of the interconnection node crosses the reference potential; and
switching, by the current generator, the AC current between a high level and a low level at each switching of the binary signal.

7. The method according to claim 6, further comprising:
measuring, by second circuit, the frequency of the voltage of the interconnection node; and
measuring, by a counter in the second circuit, a frequency of the binary signal.

8. A method, comprising:
series-coupling an inductive element and a first capacitive element between a first node and a second node;
coupling a first metal-oxide semiconductor (MOS) transistor between the first node and a third node;

coupling the second node to the third node directly or via a second MOS transistor;

receiving, at the third node, a reference potential;

coupling a second capacitive element between a fourth node and an interconnection node between the first capacitive element and the inductive element;

generating, by a current generator, an alternating current (AC) current to the fourth node;

coupling the first node and the second node to the third node and opening a switch during an estimation phase of a quality factor of the inductive element, wherein the switch is deactivated otherwise;

measuring, by a second circuit, a resonance frequency of the inductive element and the first capacitive element during the estimation phase;

measuring, by a first circuit, a voltage of the interconnection node in response to the AC current having a frequency equal to the measured resonance frequency; and closing the switch at an end of the estimation phase.

9. The method of claim 8, wherein a first capacitance of the first capacitive element is at least 100 times higher than a second capacitance of the second capacitive element.

10. The method of claim 8, wherein the first MOS transistor is part of a half-bridge, wherein the method further comprises:

coupling the half-bridge between the third node and a sixth node; and receiving, by the half-bridge, a second supply voltage.

11. The method of claim 10, wherein the second node is coupled to the third node via the second MOS transistor, and wherein the second MOS transistor is part of a second half-bridge, the method further comprising coupling the second half-bridge between the third node and the sixth node.

12. The method of claim 8, wherein a frequency of the current generator is controllable.

13. The method of claim 12, further comprising controlling, by a circuit, the frequency of the current generator such that the frequency of the current generator is equal to a frequency of a voltage of the interconnection node.

14. The method of claim 13, wherein measuring the resonance frequency comprises measuring, by the second circuit, the frequency of the voltage of the interconnection node.

15. The method of claim 13, further comprising:

providing, by a detector of the circuit, a binary signal;

switching, by the detector, the binary signal each time the voltage of the interconnection node crosses the reference potential; and switching, by the current generator, the AC current between a high level and a low level at each switching of the binary signal.

16. The method of claim 15, wherein measuring the resonance frequency comprises measuring, by the second circuit, the frequency of the voltage of the interconnection node, wherein the method further comprises measuring, by a counter of the second circuit, a frequency of the binary signal.

17. The method of claim 8, further comprising measuring, by a circuit, a voltage of the interconnection node.

18. A method, comprising:

arranging an inductive element and a first capacitive element between a first node and a second node as series-coupled, a first metal-oxide semiconductor (MOS) transistor between the first node and a third node, the second node to be coupled to the third node directly or via a second MOS transistor, a second capacitive element between a fourth node and an interconnection node between the first capacitive element and the inductive element, a switch between the fourth node and the third node;

receiving, at the third node, a reference potential;

generating, by a current generator, an alternating current (AC) current to the fourth node; and opening the switch at a beginning of an estimation phase of a quality factor of the inductive element;

coupling the first node and second node to the third node during the estimation phase;

opening the switch at an end of the estimation phase;

measuring, by a second circuit, a resonance frequency of the inductive element and the first capacitive element; and measuring, by a first circuit, a voltage of the interconnection node during the estimation phase in response to the AC current having a frequency equal to the measured resonance frequency.

19. The method of claim 18, wherein a first capacitance of the first capacitive element is at least 100 times higher than a second capacitance of the second capacitive element, the method further comprising estimating, by the second circuit, the quality factor of the inductive element based on the measured voltage, a capacitive value of the first capacitive element, and a value of the AC current.

20. The method of claim 18, further comprising:

providing, by a detector, a binary signal;

switching, by the detector, the binary signal each time the voltage of the interconnection node crosses the reference potential; and switching, by the current generator, the AC current between a high level and a low level at each switching of the binary signal.

* * * * *

UNITED STATES PATENT AND TRADEMARK OFFICE
CERTIFICATE OF CORRECTION

PATENT NO. : 12,160,117 B2
APPLICATION NO. : 18/154394
DATED : December 3, 2024
INVENTOR(S) : Cimaz et al.

It is certified that error appears in the above-identified patent and that said Letters Patent is hereby corrected as shown below:

On the Title Page

Item (73), in Column 1, in "Assignees", Line 3, delete "Agrat" and insert -- Agrate --.

In the Claims

In Column 12, in Claim 7, Line 59, delete "by" and insert -- by a --.

Signed and Sealed this
Seventh Day of January, 2025

Derrick Brent
*Acting Director of the United States Patent and Trademark Office*